(12) United States Patent
Riedl et al.

(10) Patent No.: US 10,079,594 B2
(45) Date of Patent: Sep. 18, 2018

(54) CURRENT REDUCTION FOR ACTIVATED LOAD

(71) Applicant: Infineon Technologies AG, Neubiberg (DE)

(72) Inventors: Christoph Riedl, Villach (AT); Robert Illing, Finkenstein (AT)

(73) Assignee: Infineon Technologies AG, Neubiberg (DE)

( * ) Notice: Subject to any disclaimer, the term of this patent is extended or adjusted under 35 U.S.C. 154(b) by 171 days.

(21) Appl. No.: 15/284,288

(22) Filed: Oct. 3, 2016

(65) Prior Publication Data

US 2018/0097398 A1    Apr. 5, 2018

(51) Int. Cl.
| | | |
|---|---|---|
| H03K 17/00 | (2006.01) |
| B60R 16/03 | (2006.01) |
| H03K 17/94 | (2006.01) |
| B60L 1/00 | (2006.01) |
| H03K 17/20 | (2006.01) |
| H02J 4/00 | (2006.01) |

(52) U.S. Cl.
CPC .............. H03K 17/002 (2013.01); B60L 1/00 (2013.01); B60R 16/03 (2013.01); H02J 4/00 (2013.01); H03K 17/20 (2013.01); H03K 17/94 (2013.01)

(58) Field of Classification Search
CPC ...... H03K 17/18; H03K 17/002; H03K 17/20; H03K 17/94; H02J 7/0032; H02J 7/0031; H02J 7/0063; H02J 4/00; B60L 1/00; B60L 1/14; B60L 1/16; B60R 16/03
See application file for complete search history.

(56) References Cited

U.S. PATENT DOCUMENTS

| | | | | |
|---|---|---|---|---|
| 2003/0098211 A1* | 5/2003 | Saito | ................ | B60G 17/0185 191/3 |
| 2013/0297147 A1* | 11/2013 | Cheon | ................ | B60R 16/03 701/36 |
| 2015/0035385 A1* | 2/2015 | Sander | ............... | H03K 17/0822 307/125 |

(Continued)

OTHER PUBLICATIONS

"Power distribution for start-stop systems with a dual battery approach," Infineon Technologies AG, retrieved from http://www.infineon.com/cms/en/applications/automotive/body-convenience/pdm/ on Oct. 3, 2016, 4 pp.

(Continued)

*Primary Examiner* — Ryan Johnson
(74) *Attorney, Agent, or Firm* — Shumaker & Sieffert, P.A.

(57) ABSTRACT

In one example, a circuit includes an input, an output, and a control module. The input is configured to receive a control signal indicating whether to activate or deactivate a load. The output is configured to supply current to activate the load. The control module is configured to determine whether a state of the circuit is a low current consumption mode (LCCM). In response to determining that the state of the circuit is not the LCCM, the control module is configured to determine whether the control signal indicates to activate the load and output, at the output, the current to activate the load. In response to determining that the state of the circuit is the LCCM, the control module is configured to ignore the control signal indicating whether to activate or deactivate the load and output, at the output, the current to activate the load.

20 Claims, 9 Drawing Sheets

(56) References Cited

U.S. PATENT DOCUMENTS

2015/0207306 A1\* 7/2015 Petruzzi ............... G01R 19/165
361/115

OTHER PUBLICATIONS

"ATOF Blade Fuses Rated 32V," Littelfuse, retrieved from http://www.littelfuse.com/~/media/automotive/datasheets/fuses/passenger-car-and-commercial-vehicle/blade-fuses/littelfuse_atof_datasheet.pdf on Oct. 3, 2016, 1 pp.
"LM26003-xx 3-A Switching Regulator With High Efficiency Sleep Mode," Texas Instruments, Feb. 2015, 32 pp.
"Smart High-side Switch Module (Triple 6.0 mOhm and Dual 17 mOhm)," Rev. 5.0, Freescale Semiconductor, Apr. 2014, 41 pp.
"Power management for on-board electrical systems of agricultural and construction machinery," Radel, retrieved from http://radel.co.za/website/index.php?option=com_content&view=article&id=73:power-management&catid=34:e-t-a&Itemid=56 on Oct. 3, 2016, 13 pp.

\* cited by examiner

CURRENT REDUCTION FOR ACTIVATED LOAD

TECHNICAL FIELD

This disclosure relates a switching unit, such as a smart power switch (SPS), that is configured to activate and deactivate an external load.

BACKGROUND

Smart power switches (SPSs) may supply power to external loads, even when a device is turned off. For example, when an automobile is parked with the engine off, some loads may be deactivated until the engine is started. An SPS may permit some loads to be activated while the automobile is parked with the engine off. A current consumption while the automobile is parked with the engine off is minimized so that a battery of the automobile has sufficient energy to start the engine.

SUMMARY

In general, this disclosure is directed to techniques for reducing a current consumption of a switching circuit, for instance, but not limited to, a smart power switch (SPS), during a low current consumption mode (LCCM). In the example of automobiles, LCCM may occur when the switching circuit activates (e.g., turns on) loads while the automobile is parked with the engine off. In some examples, rather than requiring an 'IN' signal that is received by a switching circuit to be held high during a LCCM, one or more techniques may permit the 'IN' signal received at the switching circuit to be held low. For example, the switching circuit may determine when to exit the LCCM and transmit, to a controller that generates the 'IN' signal, a signal to wake up the controller. In another example, the controller (or another device) may determine when to exit the LCCM and transmit, to the switching circuit, a command to exit the LCCM. In any case, permitting the 'IN' signal received at the switching circuit to be held low may reduce a current consumption by the switching circuit during LCCM by approximately 42% relative to a current consumption by the switching circuit when the 'IN' signal is held high.

In an example, a method includes determining, by a circuit, whether a state of the circuit is a LCCM. In response to determining that the state of the circuit is not the LCCM, the method includes determining, by the circuit, whether a control signal received at an input of the circuit indicates whether to activate or deactivate a load and in response to determining that the control signal received at the input of the circuit indicates to activate the load, outputting, at an output of the circuit, current to activate the load. In response to determining that the state of the circuit is the LCCM, the method includes ignoring, by the circuit, the control signal indicating whether to activate or deactivate the load, and outputting, by the circuit, at the output of the circuit, the current to activate the load.

In another example, a circuit includes an input, an output, and a control module. The input is configured to receive a control signal indicating whether to activate or deactivate a load. The output is configured to supply current to activate the load. The control module is configured to determine whether a state of the circuit is a LCCM. In response to determining that the state of the circuit is not the LCCM, the control module is configured to determine whether the control signal indicates to activate the load and in response to determining that the control signal received at the input of the circuit indicates to activate the load, output, at the output, the current to activate the load. In response to determining that the state of the circuit is the LCCM, the control module is configured to ignore the control signal indicating whether to activate or deactivate the load and output at the output, the current to activate the load.

In another example, a system includes a first load, a second load, an energy storage unit, a controller, and a switching circuit. The energy storage unit is configured to supply energy to the first load and to the second load. The controller is configured to output one or more control signals indicating whether to activate the first load and whether to activate the second load. The switching circuit is configured to determine whether a state of the system is a LCCM. In response to determining that the state of the system is not the LCCM, the switching circuit is configured to selectively couple the energy storage unit to the first load and to the second load based on the one or more control signals. In response to determining that the state of the system is the LCCM, the switching circuit is configured to ignore the one or more control signals indicating whether to activate the first load and whether to activate the second load and couple the energy storage unit to the first load and to the second load.

Details of these and other examples are set forth in the accompanying drawings and the description below. Other features, objects, and advantages will be apparent from the description and drawings, and from the claims.

DETAILED DESCRIPTION

Some systems may use an input ('IN') pin of a smart power switch (SPS) to control whether an external load of the SPS is activated or deactivated. For example, a microcontroller may generate a high signal (e.g., logical '1') to control SPS to couple a battery in series with an external load. In the example, the microcontroller may generate a low signal (e.g., logical '0') to control the SPS to decouple the battery from the external load. In such systems, the SPS may operate in a low current consumption mode (LCCM), where a minimum amount of current is supplied by the battery. However, such systems may require that the microcontroller output the high signal to the IN pin of the SPS before the SPS may operate in the LCCM. Moreover, once the SPS operates in the LCCM, the microcontroller must output the high signal to the IN pin of the SPS to keep the SPS operating in the LCCM. However, due to electromagnetic compatibility (EMC) reasons, the current supplied by the microcontroller to output the high signal to the IN pin of the SPS may be significant. For example, an overall current consumption of the SPS may be 50 micro-amperes ($\mu A$). In the example, for EMC reasons, the current supplied by the microcontroller to output the high signal to the IN pin of the SPS may be 29 micro-amperes ($\mu A$) or approximately 58% of the overall current consumption of the SPS in LCCM mode.

In some examples, a state definition permits the microcontroller to output the low signal to the IN pin of the SPS while the SPS operates in the LCCM. For example, the SPS may determine when to exit the LCCM and transmit, to the microcontroller, a signal to wake up the controller. In another example, the microcontroller (or another device) may determine when to exit the LCCM and transmit, to another pin of the SPS, for instance, a diagnostic pin, a command to exit the LCCM. In this manner, current consumption by the SPS during LCCM may be reduced by approximately 42% relative to a current consumption by the SPS when the microcontroller outputs a high signal to the IN pin of the SPS.

Figure 1:
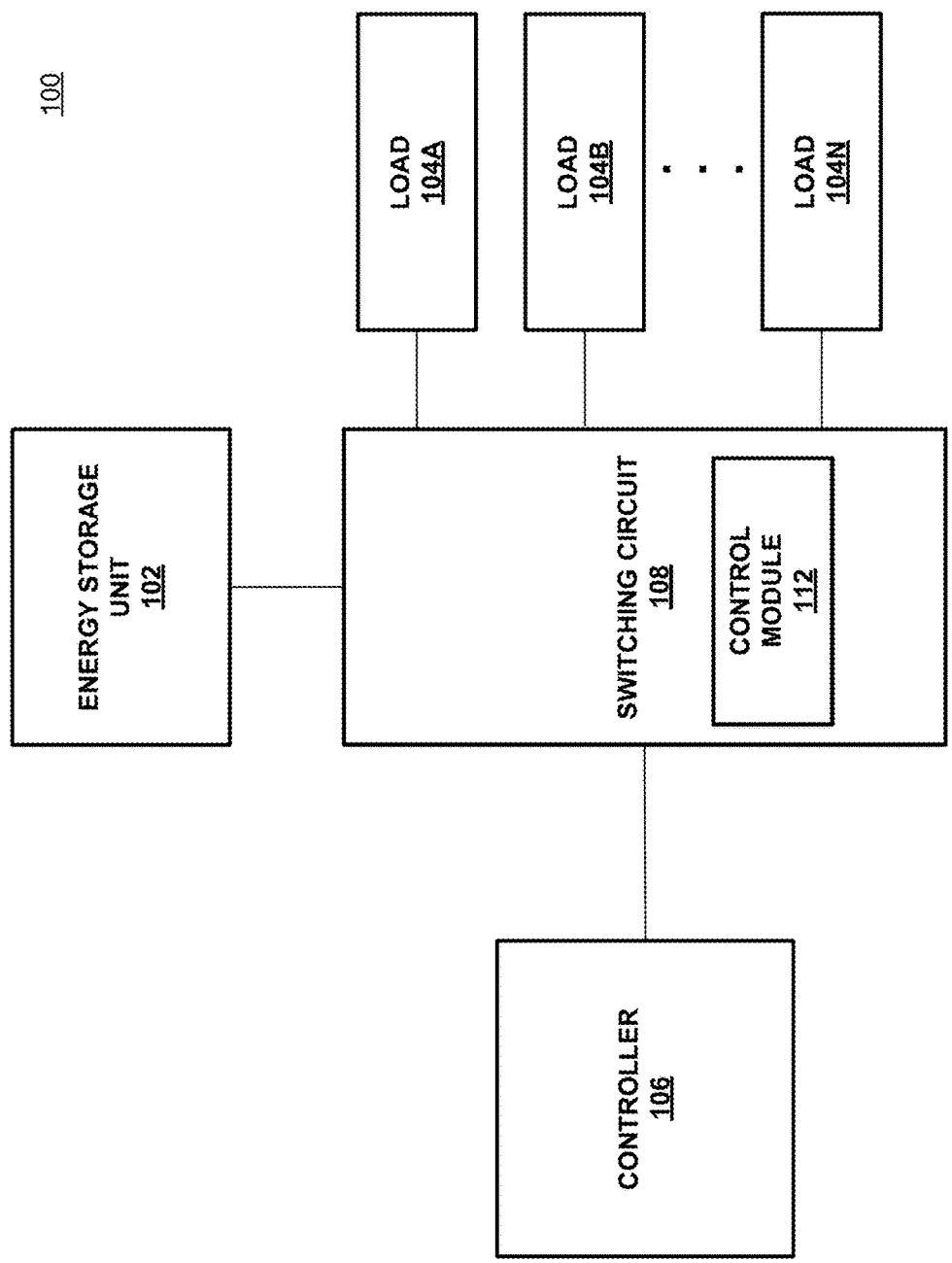
FIG. 1 is a block diagram illustrating an example system configured to operate in LCCM, in accordance with one or more techniques of this disclosure.

FIG. 1 is a block diagram illustrating an example system 100 configured to operate in LCCM, in accordance with one or more techniques of this disclosure. As illustrated in the example of FIG. 1, system 100 may include energy storage unit 102, load 104A, load 104B, . . . , load 104N (collectively "loads 104"), controller 106, and switching circuit 108.

Energy storage unit 102 may include any suitable energy storage device that permits system 100 to operate in LCCM. In some examples, energy storage unit 102 may receive energy from an energy source (e.g., an alternator coupled to a combustion engine, electrical grid connection, or another energy source) when system 100 is not operating in LCCM (e.g., during a normal operating mode). Energy storage unit 102 may include mechanical energy storage devices (e.g., flywheel), electrical energy storage devices (e.g., capacitor, super capacitors), electrochemical energy storage devices (e.g., batteries), or other types of energy storage devices. Examples of batteries may include lead-acid, nickel metal hydride, lithium ion, or other types of batteries.

Loads 104 may include devices configured to accept, via switching circuit 108, current from energy storage unit 102. In some examples, loads 104 may be resistive. Examples of resistive loads may include seat adjustment, auxiliary heating, window heating, light emitting diodes (LEDs), rear lighting, or other resistive loads. In some examples, loads 104 may be inductive. Examples of inductive loads may include actuators, motors, and pumps used in one or more of a wiper system, anti-lock brake system (ABS), electronic braking system (EBS), relay, battery disconnect, fan, or other systems that include inductive loads. In some examples, loads 104 may be capacitive. Examples of capacitive loads may include lighting elements, such as a Xenon arc lamp.

Controller 106 may be configured to control switching circuit 108 to couple energy storage unit 102 in series with one or more of external loads 104. In some examples, controller 106 may be configured to determine whether to exit LCCM. In some examples, controller 106 may include an analog circuit. In some examples, controller 106 may be a microcontroller on a single integrated circuit containing a processor core, memory, inputs, and outputs. For example, controller 106 may include one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. In some examples, controller 106 may be a combination of one or more analog components and one or more digital components.

Switching circuit 108 may be configured to selectively couple energy storage unit 102 in series with one or more of external loads 104. In some examples, switching circuit 108 may be configured to determine whether to exit LCCM. In some examples, switching circuit 108 may be a SPS, while in other examples switching circuit 108 may be different. Switching circuit 108 may include a switching element. Examples of switching elements may include, but are not limited to, silicon controlled rectifier (SCR), a Field Effect Transistor (FET), and bipolar junction transistor (BJT). Examples of FETs may include, but are not limited to, junction field-effect transistor (JFET), metal-oxide-semiconductor FET (MOSFET), dual-gate MOSFET, insulated-gate bipolar transistor (IGBT), any other type of FET, or any combination of the same. Examples of MOSFETS may include, but are not limited to, PMOS, NMOS, DMOS, or any other type of MOSFET, or any combination of the same. Examples of BJTs may include, but are not limited to, PNP, NPN, heterojunction, or any other type of BJT, or any combination of the same. It should be understood that the switching element of switching circuit 108 may be a high side switch or low side switch. Additionally, although examples may illustrate switching circuit 108 using a voltage-controlled element, in some examples, switching circuit 108 may use a current-controlled element. Examples of current-controlled elements may include, but are not limited to, gallium nitride (GaN) MOSFETs, BJTs, or other current-controlled elements.

As shown, switching circuit 108 may include control module 112. Control module 112 may be configured to determine whether to exit LCCM. In some examples, control module 112 may include an analog circuit. In some examples, control module 112 may be a microcontroller on a single integrated circuit containing a processor core, memory, inputs, and outputs. In some examples, control module 112 may be a combination of one or more analog components and one or more digital components.

Rather than using a single input to control when switching circuit 108 activates one or more of loads 104, system 100 may use a state definition that permits a control signal received by switching circuit 108 to control when switching circuit 108 activates one or more of loads 104 and a separate signal to indicate when to exit LCCM. In this manner, the control signal received by switching circuit 108 to control when switching circuit 108 activates one or more of loads 104 may be held low while switching circuit 108 operates in the LCCM, thereby reducing an amount of current consumption of switching circuit 108.

System 100 determines whether a state of switching circuit 108 is LCCM. In some examples, controller 106 may determine whether the state of switching circuit 108 is LCCM. In some examples, control module 112 of switching circuit 108 may determine whether the state of switching circuit 108 is LCCM. More specifically, in some examples, a dedicated input pin (e.g., a wakeup pin, power down pin) may be used by controller 106 and/or control module 112 of switching circuit 108 to determine whether the state of switching circuit 108 is LCCM. In some examples, one or more bus interface messages (e.g., serial peripheral interface (SPI) command, local interconnect network (LIN) command) may be used by controller 106 and/or control module 112 of switching circuit 108 to determine whether the state of switching circuit 108 is LCCM. In some examples, one or more internal state machines detecting an idle mode may be used by controller 106 and/or control module 112 of switching circuit 108 to determine whether the state of switching circuit 108 is LCCM. For instance, in response to control module 112 of switching circuit 108 detecting that all channels of system 100 are operating in an off state, control module 112 of switching circuit 108 may determine that the state of the system is LCCM.

In response to determining that the state of switching circuit 108 is not the LCCM, control module 112 of switching circuit 108 determines whether a control signal received at an input of switching circuit 108 indicates whether to activate or deactivate load 104A. For example, in response to control module 112 of switching circuit 108 determining that the control signal received at an IN pin of switching circuit 108 indicates a high signal (e.g., logical '1'), control module 112 of switching circuit 108 may determine that the control signal received at the input of the switching circuit 108 indicates to activate load 104A. In response, however, to control module 112 of switching circuit 108 determining that the control signal received at the IN pin of switching circuit 108 indicates a low signal (e.g., logical '0'), control module 112 of switching circuit 108 may determine that the control signal received at the input of the switching circuit 108 indicates to deactivate load 104A.

In response to determining that the control signal received at the input of the switching circuit 108 indicates to activate load 104A and that the state of switching circuit 108 is not the LCCM, switching circuit 108 outputs, at an output of switching circuit 108, current to activate load 104A. For example, switching circuit 108 couples energy storage unit 102 in series, with load 104A.

In response, however, to determining that the control signal received at the input of the switching circuit 108 indicates to deactivate load 104A and that the state of switching circuit 108 is not the LCCM, switching circuit 108 refrains from outputting, at an output of switching circuit 108, current to activate load 104A. For example, switching circuit 108 may refrain from coupling energy storage unit 102 in series, with load 104A until the control signal received at the input of the switching circuit 108 indicates to activate load 104A.

In response, however, to determining that the state of switching circuit 108 is the LCCM, control module 112 of switching circuit 108 ignores the control signal received at the input of switching circuit 108 that indicates whether to activate or deactivate load 104A. For example, switching circuit 108 outputs, at an output of switching circuit 108, current to activate load 104A when the control signal received at the input of the switching circuit 108 indicates to activate load 104A and when the control signal received at the input of the switching circuit 108 indicates to deactivate load 104A.

In some examples, in response to determining that the state of switching circuit 108 is the LCCM, control module 112 of switching circuit 108 may determine whether a condition to exit the LCCM exists. For example, control module 112 of switching circuit 108 may determine whether the condition to exit the LCCM exists based on a signal received on a dedicated input pin of switching circuit 108, one or more bus interface messages received by the control module 112 of switching circuit 108, and one or more internal state machines of control module 112. In response to determining that the condition to exit the LCCM exists, control module 112 of switching circuit 108 determines that switching circuit 108 is not the LCCM.

In some examples, in response to determining that the state of switching circuit 108 is the LCCM, controller 106 may determine whether a condition to exit the LCCM exists. For example, controller 106 may determine whether the condition to exit the LCCM exists based on a signal received on a dedicated input pin of controller 106, one or more bus interface messages received by the controller 106, and one or more internal state machines of controller 106. In response to determining that the condition to exit the LCCM exists, controller 106 may transmit to switching circuit 108 an instruction to exit the LCCM. In response to receiving the instruction to exit the LCCM, control module 112 of switching circuit 108 may determine that switching circuit 108 is not the LCCM.

In any case, when control module 112 of switching circuit 108 and/or controller 106 determines that a condition to exit the LCCM exists, control module 112 of switching circuit 108 may determine that the state of switching circuit 108 is not the LCCM. For example, in response to determining that a condition to exit the LCCM exists and that the state of switching circuit 108 is not the LCCM, switching circuit 108 may activate loads according to a control signal that is output by controller 106 and received at the input of switching circuit 108. More specifically, control module 112 of switching circuit 108 may cause switching circuit 108 to activate load 104A when a control signal, received at the IN pin of switching circuit 108, indicates a high signal and may cause switching circuit 108 to deactivate load 104A when the control signal, received at the IN pin of switching circuit 108, indicates a low signal. However, in response to determining that a condition to exit the LCCM does not exist, control module 112 of switching circuit 108 may refrain from changing the state of switching circuit 108 from the LCCM. For example, control module 112 of switching circuit 108 may ignore the control signal received at the IN pin of switching circuit 108 that indicates whether to activate or deactivate load 104A.

In this manner, one or more techniques described use a state definition that permits controller 106 to output a low signal to an input pin of switching circuit 108 while switching circuit 108 operates in the LCCM. In this manner, current consumption by switching circuit 108 during the LCCM may be reduced by approximately 42% relative to a current consumption by switching circuit 108 when controller 106 outputs a high signal to the input pin of switching circuit 108. Additionally, control module 112 of switching circuit 108 may determine when to exit the LCCM and transmit, to controller 106, a signal to wake up the controller, thereby permitting controller 106 to enter a sleep state that may further reduce a current consumption of system 100 during the LCCM.

Although one or more techniques applied in the example of FIG. 1 were applied to load 104A, such techniques may be applied to any combination of loads 104. For instance, one or more techniques applied in the example of FIG. 1 may be substantially applied using load 104B, load 104C, load 104N, or another one of loads 104. In another example, one or more techniques applied in the example of FIG. 1 may be substantially applied to a combination of two or more loads 104. For instance, one or more techniques applied in the example of FIG. 1 may be substantially applied using load 104A and load 104B, load 104B and load 104C, load 104A-N, or another combination of loads 104.

Figure 2:
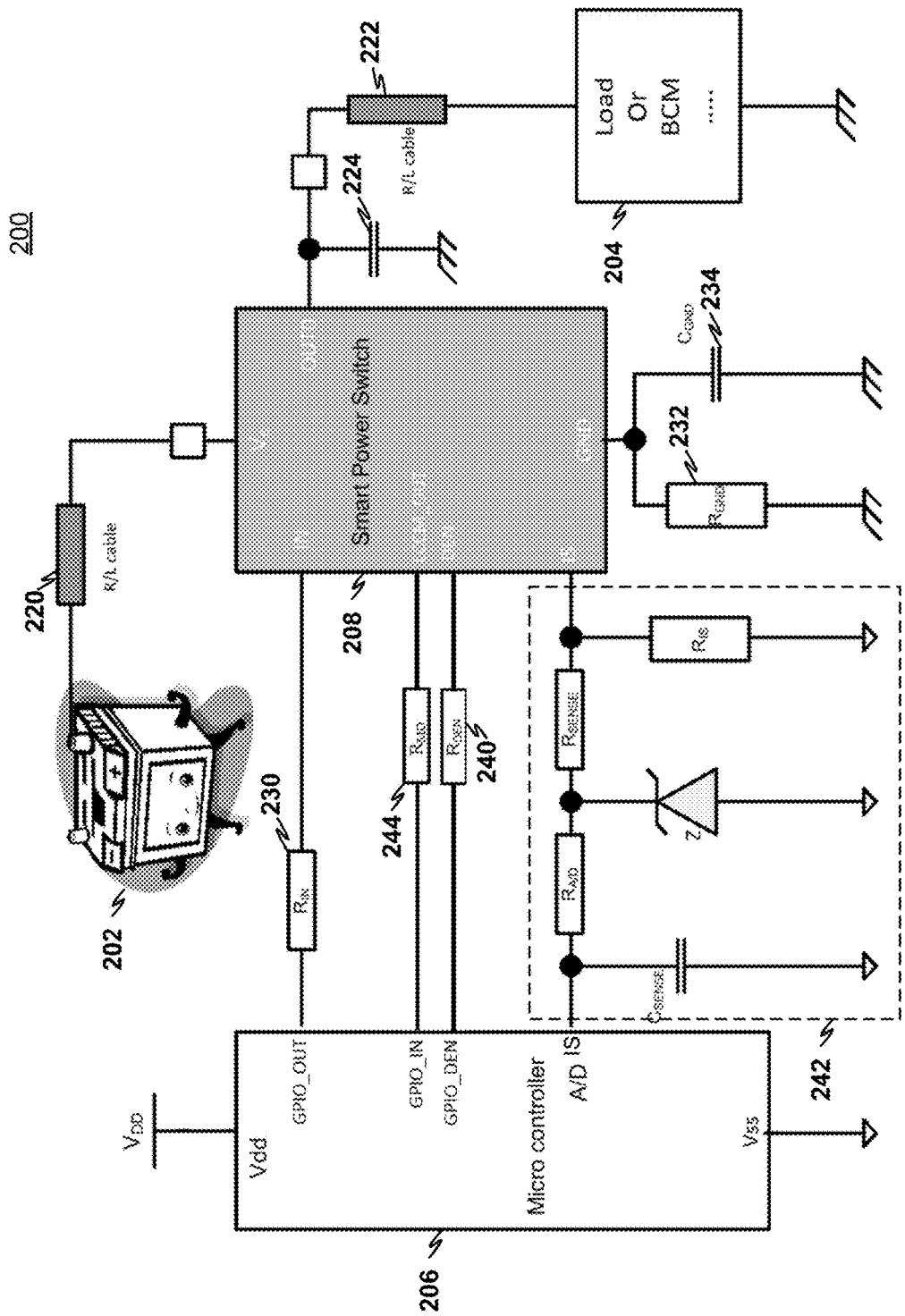
FIG. 2 is a circuit diagram illustrating an example first circuit of the system of FIG. 1, in accordance with one or more techniques of this disclosure.

FIG. 2 is a circuit diagram illustrating an example first circuit 200 of system 100 of FIG. 1, in accordance with one or more techniques of this disclosure. As illustrated circuit 200 includes battery 202, load 204, microcontroller 206, and smart power switch (SPS) 208. Battery 202 may be an example of energy storage unit 102 of FIG. 1. Load 204 may be an example of load 104A of FIG. 1. Microcontroller 206 may be an example of controller 106 of FIG. 1. SPS 208 may be an example of switching circuit 108 of FIG. 1.

SPS 208 may include a voltage source pin ($V_S$), a ground pin (GND), an input pin (IN), an output pin (OUT0), a LCCM output pin (LCCM_OUT), a diagnostics enable pin (DEN), and a current diagnosis pin (IS). As used herein, ground may refer to one or more of a reference node, earth ground, a grounding electrode, neutral wire, or another reference node. In some examples, SPS 208 may be configured to determine whether to exit LCCM. In some examples, SPS 208 may include an analog circuit. In some examples, SPS 208 may include a microcontroller on a single integrated circuit containing a processor core, memory, inputs, and outputs. In some examples, SPS 208 may include a combination of one or more analog components and one or more digital components.

In the example of FIG. 2, battery 202 is coupled, via cable 220, to the voltage source pin ($V_S$) of SPS 208. As shown, load 204 is coupled, via cable 222, to the output pin (OUT0) of SPS 208. Additionally, load 204 may be coupled to capacitor 224. In this manner, SPS 208 may selectively supply current from battery 202, via cables 220 and 222, to load 204.

Microcontroller 206 may include a ground pin ($V_{SS}$) coupled to ground, a voltage pin ($V_{DD}$) coupled to a voltage source (e.g., battery 202), a general purpose output pin (GPIO_OUT), a general purpose input pin (GPIO_IN), a diagnostics enable pin (GPIO_DEN), and a current diagnosis pin (IS). In some examples, microcontroller 206 may be on a single integrated circuit containing a processor core, memory, inputs, and outputs. In some examples, microcontroller 206 may be a combination of one or more analog components and one or more digital components.

The GPIO_OUT pin of microcontroller 206 is coupled, via resistive element 230, to the input pin (IN) of SPS 208. In this manner, microcontroller 206 may control, via SPS 208, a current flow from battery 202 to load 204. For instance, microcontroller 206 may output, from the GPIO_OUT pin of microcontroller 206 to the IN pin of SPS 208, a high signal (e.g., logical '1') to cause SPS 208 to permit current to flow from battery 202 to load 204, thereby activating load 204. However, microcontroller 206 may output, from the GPIO_OUT pin of microcontroller 206 to the IN pin of SPS 208, a low signal (e.g., logical '0') to cause SPS 208 to prevent current from flowing between battery 202 and load 204, thereby deactivating load 204.

As previously discussed, permitting an 'IN' signal received at the IN pin of SPS 208 to be held low may reduce a current consumption by SPS 208 during LCCM by approximately 42% relative to a current consumption by SPS 208 when microcontroller 206 outputs a high signal to the IN pin of SPS 208.

Microcontroller 206 and SPS 208 may be configured for a diagnostics mode. In some examples, microcontroller 206 may initiate the diagnostics mode by outputting, via resistive element 240, a diagnostics signal from the GPIO_DEN pin of microcontroller 206 to the DEN pin of SPS 208. The IS pin of microcontroller 206 may detect one or more electrical characteristics (e.g., voltage, current, or another electrical characteristic) using diagnostics circuit 242 when the DEN pin of SPS 208 is enabled (e.g., logical '1').

Microcontroller 206 and SPS 208 may be configured for LCCM. As used herein, LCCM may refer to any state where a current or power consumption of SPS 208 is minimized. In some examples, LCCM may refer to any state where a current or power consumption by SPS 208 and microcontroller 206 is minimized. In some examples, SPS 208 may be configured to output, at the LCCM_OUT pin of SPS 208, to the GPIO_IN pin of microcontroller 206, an indication of whether the state of SPS 208 is the LCCM or is not the LCCM. More specifically, SPS 208 may output, at the LCCM_OUT pin of SPS 208, to the GPIO_IN pin of microcontroller 206, a first signal (e.g., low) to indicate that SPS 208 remains in the LCCM and a second signal (e.g., high) to indicate that SPS 208 is not in the LCCM (e.g., is out of the LCCM).

Rather than microcontroller 206 necessarily outputting, at the GPIO_OUT pin, to the IN pin of SPS 208, a high signal, SPS 208 may be configured to permit microcontroller 206 to output, at the GPIO_OUT pin, to the IN pin of SPS 208, a low signal during the LCCM state. SPS 208 may determine whether the state of SPS 208 is the LCCM, and may output, at the LCCM_OUT pin, via resistive element 244, to the GPIO_IN pin of microcontroller 206, an indication that the state of SPS 208 is or is not the LCCM. In this manner, microcontroller 206 and SPS 208 may be configured to permit an 'IN' signal received at the IN pin of SPS 208 to be held low to reduce a current consumption by SPS 208 during LCCM. Additionally, SPS 208 may output, at the LCCM_OUT pin, to the GPIO_IN pin of microcontroller 206, a signal to wake up the microcontroller, thereby permitting microcontroller 206 to use a sleep state that may further reduce a current consumption of circuit 200 during the LCCM.

Figure 3:
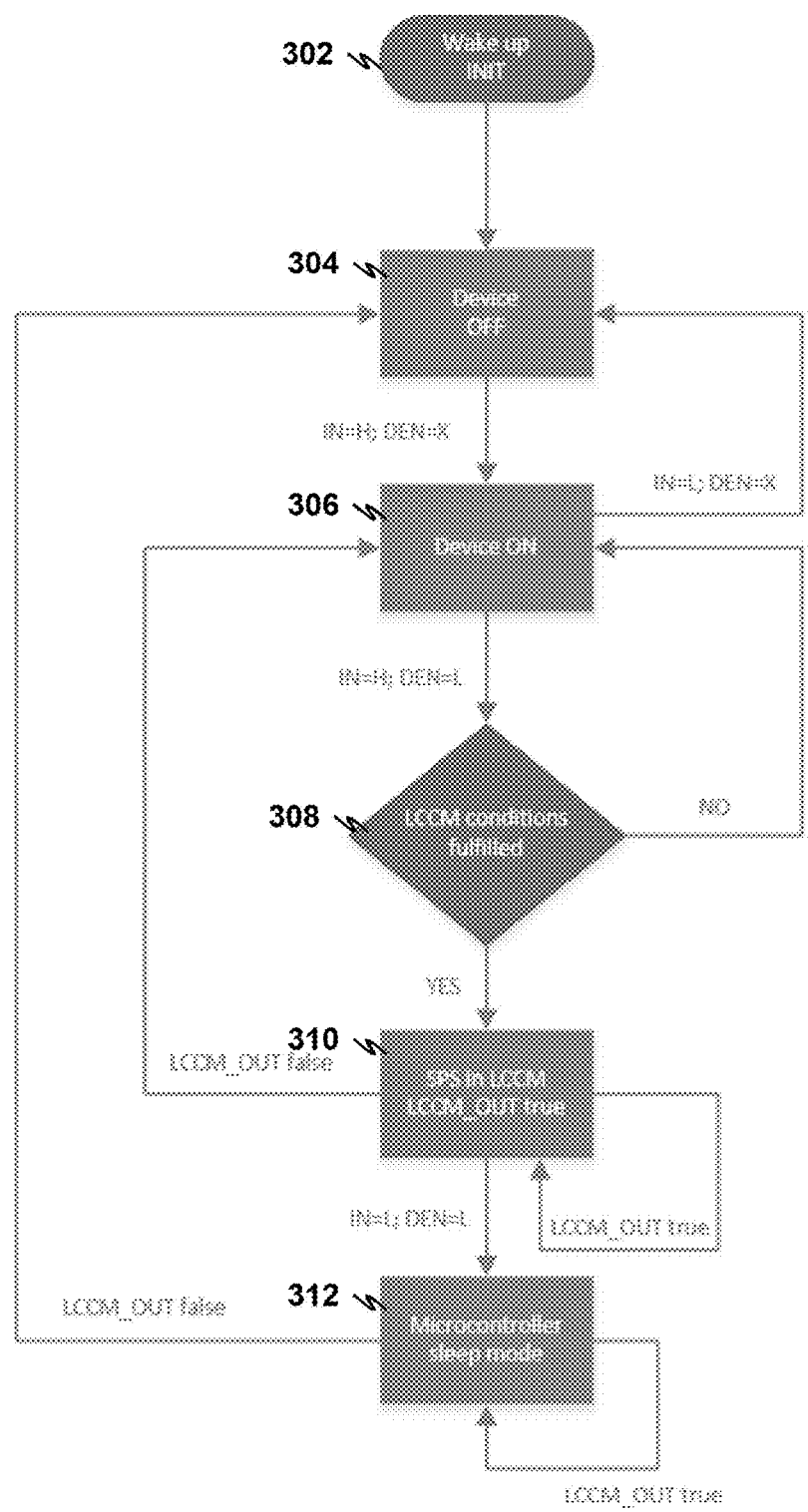
FIG. 3 is a flow diagram consistent with techniques that may be performed by the first example circuit of FIG. 2, in accordance with this disclosure.

FIG. 3 is a flow diagram consistent with techniques that may be performed by the first example circuit of FIG. 2, in accordance with this disclosure. For purposes of illustration only, the example operations are described below within the context of circuit 200, as shown in FIG. 2. However, the techniques described below can be used in any permutation, and in any combination, with battery 202, load 204, microcontroller 206, and SPS 208.

In accordance with one or more techniques of this disclosure, microcontroller 206 wakes up and initializes (302). For instance, battery 202 may be coupled to the $V_{DD}$ and $V_{SS}$ pins of microcontroller 206. In response to waking up and initializing, microcontroller 206 operates in a device off state (304). For instance, microcontroller 206 may output a low signal (e.g., logical '0') to prevent current from flowing between battery 202 and load 204, thereby deactivating load 204. During the device off state, SPS 208 may ignore whether a state of circuit 200 includes a diagnostics mode. For instance, SPS 208 ignores a signal on the DEN pin of SPS 208 during the device off state. In some instances, SPS 208 refrains from determining whether circuit 200 is in the diagnostics state. In some examples, during the device off state, SPS 208 may determine whether a state of circuit 200 includes a diagnostics mode. For example, SPS 208 may determine whether a sensing function is activated.

In the example of FIG. 3, microcontroller 206 determines whether to transition from the device off state to the device on state. In response to determining to transition from the device off state to the device on state, microcontroller 206 operates in the device on state (306). For example, during the device on state, microcontroller 206 may output a high signal (e.g., logical '1'), at the GPIO_OUT pin of microcontroller 206, to the IN pin of SPS 208, to cause SPS 208 to permit current to flow from battery 202 to load 204, thereby activating load 204. During the device on state, microcontroller 206 determines whether to transition from the device on state to the device off state. In response to determining to transition from the device on state to the device off state, microcontroller 206 transitions from the device on state to the device off state ("IN=L; DEN=X" of 306).

During the device on state, SPS 208 may determine whether to transition from the device on state to the LCCM. For example, in response to microcontroller 206 outputting a high signal (e.g., logical '1'), at the GPIO_OUT pin of microcontroller 206, to the IN pin of SPS 208, and outputting a low signal (e.g., logical '0'), at the GPIO_DEN pin of microcontroller 206, to the DEN pin of SPS 208 ("IN=H; DEN=L" of 306), SPS 208 may determine whether LCCM conditions are fulfilled (308). In response to determining that the one or more LCCM conditions are not fulfilled, SPS 208 returns to the device on state ("NO" of 308). In response, however, to determining that the one or more LCCM conditions are fulfilled, SPS 208 transitions to the LCCM ("YES" of 308).

In response to SPS 208 transitioning to the LCCM, SPS 208 operates in LCCM and microcontroller 206 determines whether a signal output, from the LCCM_OUT pin of SPS 208, to GPIO_IN of microcontroller 206 indicates a control signal indicating a state of SPS 208 is not the LCCM and determines whether to output a high signal or a low signal at the GPIO_OUT pin of microcontroller 206 to the IN pin of SPS 208. In response to SPS 208 determining to operate in the LCCM, SPS 208 outputs, at the LCCM_OUT pin of SPS 208, to GPIO_IN of microcontroller 206 a control signal indicating that the state of SPS 208 is the LCCM (e.g., a low signal) and refrains from exiting the LCCM ("LCCM_OUT true" of 310). In response, however, to SPS 208 determining that the state of SPS 208 is not the LCCM, SPS 208 exits the LCCM and returns to the device on state ("LCCM_OUT false" of 310). Microcontroller 206 may output the low signal at the GPIO_DEN of microcontroller 206 and at the IN pin of microcontroller 206 to reduce a current consumption of SPS 208 ("IN=L; DEN=L" of 310) and microcontroller 206 enter a sleep mode (312).

During sleep mode, microcontroller 206 may refrain from determining whether to output a high signal or a low signal at the GPIO_OUT pin to the IN pin of SPS 208. In some examples, during sleep mode, microcontroller 206 may refrain from operating one or more logical devices such that a power consumption of microcontroller 206 is minimized. In any case, while microcontroller 206 operates in the sleep mode, microcontroller 206 determines whether a control signal received, from the LCCM_OUT pin of SPS 208, at the GPIO_IN pin of microcontroller 206, indicates that a state of SPS 208 is not the LCCM. For example, in response to microcontroller 206 receiving, at the GPIO_IN pin, from the LCCM_OUT pin of SPS 208, a low signal, microcontroller 206 determines that the control signal indicates the state of SPS 208 is the LCCM. In response to determining that the control signal indicates the state of SPS 208 is the LCCM, microcontroller 206 refrains from exiting the sleep mode ("LCCM_OUT true" of 312). In response, however, to determining that the control signal indicates the state of SPS 208 is not the LCCM, microcontroller 206 exits the sleep mode ("LCCM_OUT false" of 312) and returns to the device off state. For instance, microcontroller 206 outputs, from the GPIO_DEN pin, to the DEN pin of SPS 208, a high signal and outputs, at the GPIO_OUT pin, to the IN pin of SPS 208, a low signal.

Figure 4:
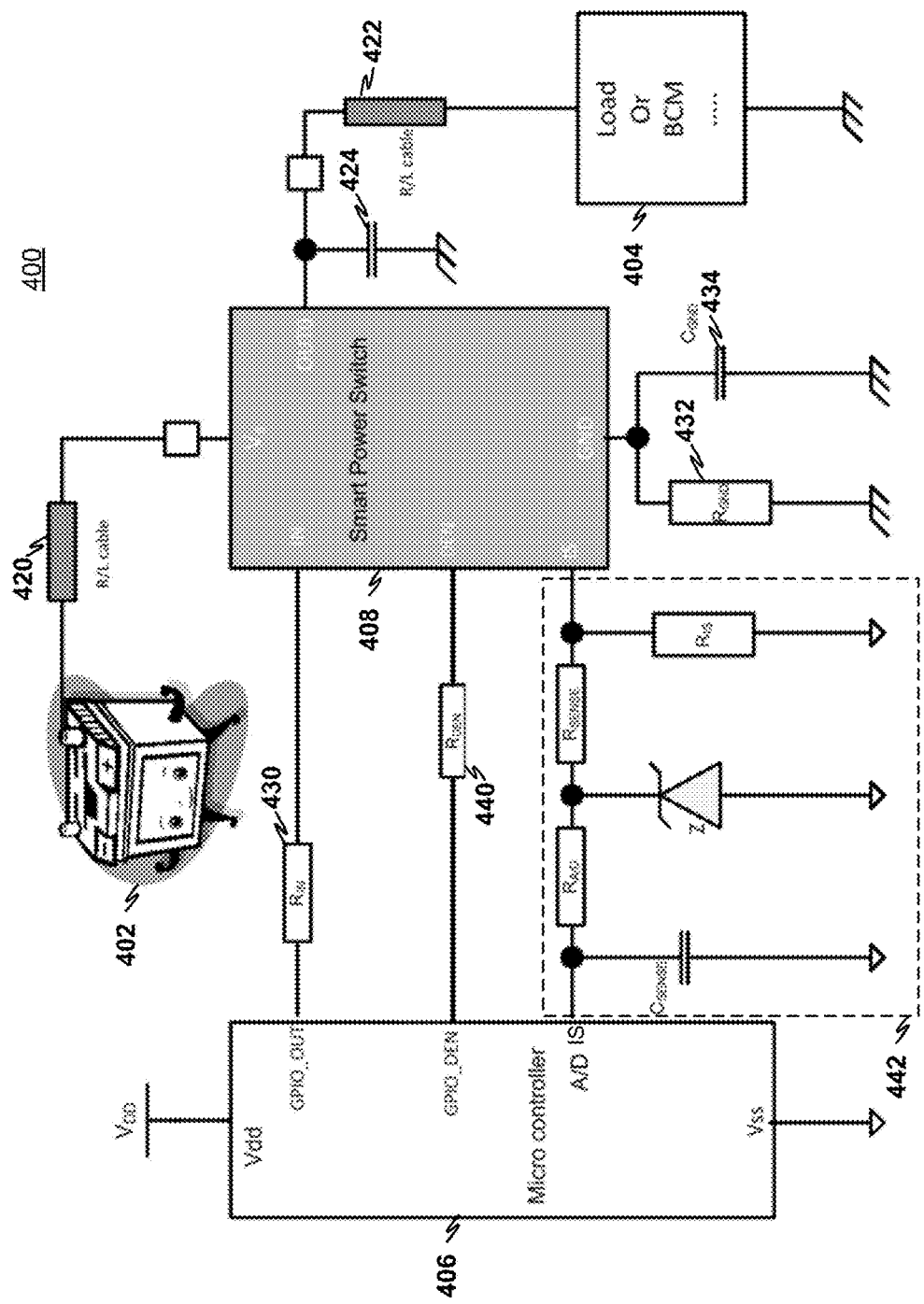
FIG. 4 is a circuit diagram illustrating an example second circuit of the system of FIG. 1, in accordance with one or more techniques of this disclosure.

FIG. 4 is a circuit diagram illustrating an example second circuit 400 of system 100 of FIG. 1, in accordance with one or more techniques of this disclosure. As illustrated circuit 400 includes battery 402, load 404, microcontroller 406, and smart power switch (SPS) 408. Battery 402 may be an example of energy storage unit 102 of FIG. 1. Load 404 may be an example of load 104A of FIG. 1. Microcontroller 406 may be an example of controller 106 of FIG. 1. SPS 408 may be an example of switching circuit 108 of FIG. 1.

SPS 408 may include a voltage source pin ($V_S$), a ground pin (GND), an input pin (IN), an output pin (OUT0), a diagnostics enable pin (DEN), and a current diagnosis pin (IS). In some examples, SPS 408 may be configured to determine whether to exit LCCM. In some examples, SPS 408 may include an analog circuit. In some examples, SPS 408 may include a microcontroller on a single integrated circuit containing a processor core, memory, inputs, and outputs. In some examples, SPS 408 may include a combination of one or more analog components and one or more digital components.

In the example of FIG. 4, battery 402 is coupled, via cable 420, to the voltage source pin ($V_S$) of SPS 408. As shown, load 404 is coupled, via cable 422, to the output pin (OUT0) of SPS 408. Additionally, load 404 may be coupled to capacitor 424. In this manner, SPS 408 may selectively supply current from battery 402, via cables 420 and 422, to load 404.

Microcontroller 406 may include a ground pin ($V_{SS}$) coupled to ground, a voltage pin ($V_{DD}$) coupled to a voltage source (e.g., battery 402), a general purpose output pin (GPIO_OUT), a diagnostics enable pin (GPIO_DEN), and a current diagnosis pin (IS). In some examples, microcontroller 406 may be on a single integrated circuit containing a processor core, memory, inputs, and outputs. In some examples, microcontroller 406 may be a combination of one or more analog components and one or more digital components.

The GPIO_OUT pin of microcontroller 406 is coupled, via resistive element 430, to the input pin (IN) of SPS 408. In this manner, microcontroller 406 may control, via SPS 408, a current flow from battery 402 to load 404. For instance, microcontroller 406 may output, from the GPIO_OUT pin of microcontroller 406 to the IN pin of SPS 408, a high signal (e.g., logical '1') to cause SPS 408 to permit current to flow from battery 402 to load 404, thereby activating load 404. However, microcontroller 406 may output, from the GPIO_OUT pin of microcontroller 406 to the IN pin of SPS 408, a low signal (e.g., logical '0') to cause SPS 408 to prevent current from flowing between battery 402 and load 404, thereby deactivating load 404.

In some examples, the GPIO_OUT pin of microcontroller 406 is coupled, via SPS 408, to the ground pin of SPS 408. In the example, the ground pin of SPS 408 is coupled, via resistive element 432, to a ground of circuit 400 and to capacitor 434. Resistive element 432 may be sized to prevent electromagnetic noise from inadvertently controlling SPS 408. For instance, resistive element 432 may be sized such that 29 micro-amperes (μA) is sufficient to control SPS 408. As previously discussed, permitting an 'IN' signal received at the IN pin of SPS 408 to be held low may reduce a current consumption by SPS 408 during LCCM by approximately 42% relative to a current consumption, when SPS 408 is in the LCCM, by SPS 408 when microcontroller 406 outputs a high signal to the IN pin of SPS 408.

Microcontroller 406 and SPS 408 may be configured for a diagnostics mode. In some examples, microcontroller 406 may initiate the diagnostics mode by outputting, via resistive element 440, a diagnostics signal from the GPIO_DEN pin of microcontroller 406 to the DEN pin of SPS 408. The IS pin of microcontroller 406 may detect one or more electrical characteristics (e.g., voltage, current, or another electrical characteristic) using diagnostics circuit 442.

Rather than microcontroller 406 necessarily outputting, at the GPIO_OUT pin, to the IN pin of SPS 408, a high signal, SPS 408 may be configured to permit microcontroller 406 to output, at the GPIO_OUT pin, to the IN pin of SPS 408, a low signal during the LCCM state. SPS 408 may determine whether the state of SPS 408 is the LCCM, and may output, at the IS pin, via diagnostics circuit 442, to the IS pin of microcontroller 406, an indication that the state of SPS 408 is or is not the LCCM. In this manner, microcontroller 406 and SPS 408 may be configured to permit an 'IN' signal received at the IN pin of SPS 408 to be held low to reduce a current consumption by SPS 408 during LCCM.

Figure 5:
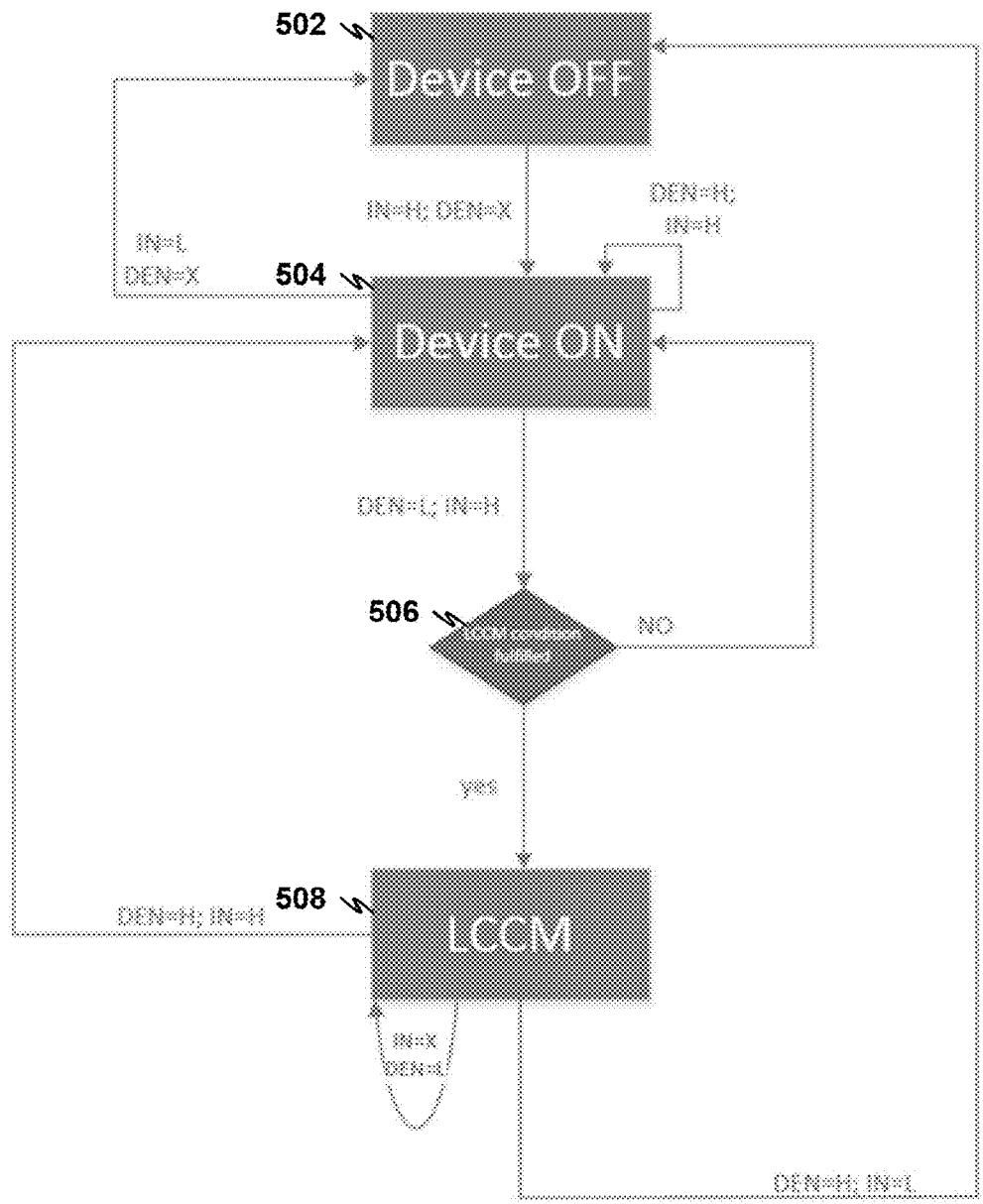
FIG. 5 is a first flow diagram consistent with techniques that may be performed by the second example circuit of FIG. 4, in accordance with this disclosure.

FIG. 5 is a first flow diagram consistent with techniques that may be performed by second example circuit 400 of FIG. 4, in accordance with this disclosure. For purposes of illustration only, the example operations are described below within the context of circuit 400, as shown in FIG. 4. However, the techniques described below can be used in any permutation, and in any combination, with battery 402, load 404, microcontroller 406, and SPS 408.

In accordance with one or more techniques of this disclosure, microcontroller 406 operates in a device off state (502). For instance, microcontroller 406 may output a low signal (e.g., logical '0') to cause SPS 408 to prevent current from flowing between battery 402 and load 404, thereby deactivating load 404. During the device off state, microcontroller 406 ignores whether a state of circuit 400 includes a diagnostics mode. For instance, SPS 408 ignores a signal on the DEN pin of SPS 408 during the device off state. In some instances, SPS 408 refrains from determining whether circuit 400 is in the diagnostics state during the device off state.

In the example of FIG. 4, microcontroller 406 determines whether to transition from the device off state to the device on state. In response to determining to transition from the device off state to the device on state, microcontroller 406 operates in the device on state (504). For example, during the device on state, microcontroller 406 may output a high signal (e.g., logical '1') to cause SPS 408 to permit current to flow from battery 402 to load 404, thereby activating load 404. During the device on state, microcontroller 406 determines whether to transition from the device on state to the device off state. For example, in response to determining to transition from the device on state to the device off state, microcontroller 406 transitions from the device on state to the device off state ("IN=L; DEN=X" of 504).

During the device on state, SPS 408 determines whether to transition from the device on state to the LCCM. For example, in response to SPS 408 determining that a signal received, at the DEN pin, from the GPIO_DEN pin of microcontroller 406, is a low signal and that a signal received, at the IN pin, from the GPIO_OUT pin of microcontroller 406, is a high signal, SPS 408 may transition from the device on state to the LCCM ("IN=H; DEN=L" of 504). In response, however, to microcontroller 406 determining that the signal received, at the DEN pin, from the GPIO_DEN pin of microcontroller 406, is a high signal, SPS 408 does not to transition from the device on state to the LCCM ("IN=H; DEN=H" of 504).

In response to determining to transition from the device on state to the LCCM, SPS 408 determines whether one or more LCCM conditions are fulfilled (506). In response to determining that the one or more LCCM conditions are not fulfilled, microcontroller 406 returns to the device on state ("NO" of 506). In response, however, to determining that the one or more LCCM conditions are fulfilled, SPS 408 transitions to the LCCM ("YES" of 506).

In response to SPS 408 transitioning to the LCCM, microcontroller 406 operates in LCCM (508). While SPS 408 operates in LCCM, microcontroller 406 outputs, at the GPIO_DEN pin of microcontroller 406, to the DEN pin of SPS 408, the low signal and outputs, at the GPIO_OUT pin, a high or low signal ("IN=X; DEN=L" of 508). In response to SPS 408 determining that a signal received, at the DEN pin, from the GPIO_DEN pin of microcontroller 406, is a high signal and that a signal received, at the IN pin, from the GPIO_OUT pin of microcontroller 406, is a high signal, SPS 408 may transition from the LCCM to the device on state ("IN=H; DEN=H" of 508). In response, however, to SPS 408 determining that a signal received, at the DEN pin, from the GPIO_DEN pin of microcontroller 406, is a high signal and that a signal received, at the IN pin, from the GPIO_OUT pin of microcontroller 406, is a low signal, SPS 408 transitions from the LCCM to the device off state ("IN=L; DEN=H" of 508). In this manner, during the LCCM of SPS 408, microcontroller 406 is permitted to output, at the GPIO_OUT pin, a low signal, thereby reducing a current consumption of SPS 408.

Figure 6:
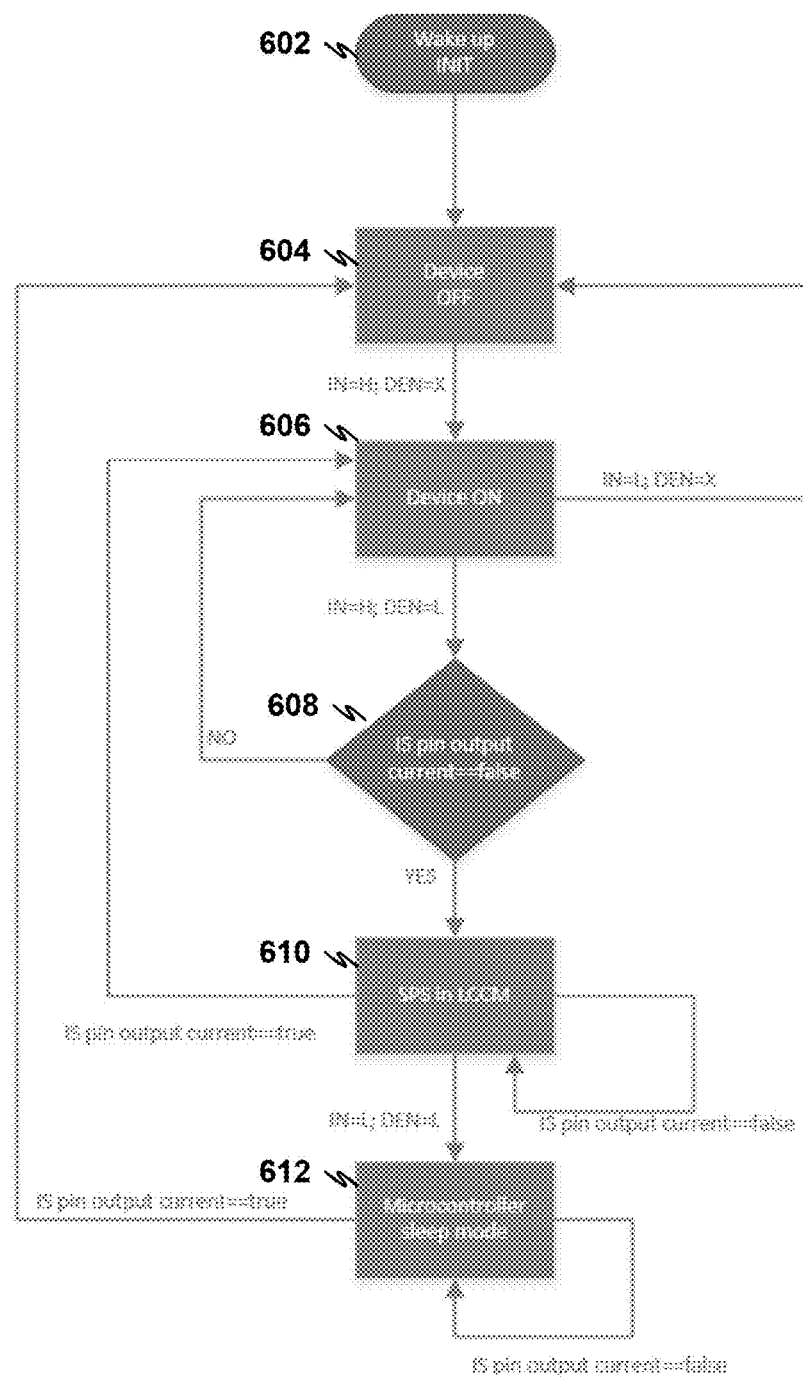
FIG. 6 is a second flow diagram consistent with techniques that may be performed by the second example circuit of FIG. 4, in accordance with this disclosure.

FIG. 6 is a second flow diagram consistent with techniques that may be performed by second example circuit 400 of FIG. 4, in accordance with this disclosure. For purposes of illustration only, the example operations are described below within the context of circuit 400, as shown in FIG. 4. However, the techniques described below can be used in any permutation, and in any combination, with battery 402, load 404, microcontroller 406, and SPS 408.

In accordance with one or more techniques of this disclosure, microcontroller 406 wakes up and initializes (602). For instance, battery 402 may be coupled to the $V_{DD}$ and $V_{SS}$ pins of microcontroller 406. In response to waking up and initializing, microcontroller 406 operates in a device off state (604). For instance, microcontroller 406 may output a low signal (e.g., logical '0') to cause SPS 408 to prevent current from flowing between battery 402 and load 404, thereby deactivating load 404. During the device off state, microcontroller 406 ignores whether a state of circuit 400 includes a diagnostics mode. For instance, SPS 408 ignores a signal at the DEN pin, from the GPIO_DEN pin of microcontroller 406, during the device off state. In some instances, SPS 408 refrains from determining whether circuit 400 is in the diagnostics state during the device off state.

In the example of FIG. 6, microcontroller 406 determines whether to transition from the device off state to the device on state. In response to determining to transition from the device off state to the device on state, microcontroller 406 operates in the device on state (606). For example, during the device on state, microcontroller 406 may output a high signal (e.g., logical '1') to cause SPS 408 to permit current to flow from battery 402 to load 404, thereby activating load 404. During the device on state, microcontroller 406 determines whether to transition from the device on state to the device off state. In response to determining to transition from the device on state to the device off state, microcontroller 406 transitions from the device on state to the device off state ("IN=L; DEN=X" of 606).

During the device on state, SPS 408 determines whether to transition from the device on state to the LCCM. For example, in response to SPS 408 determining that a signal received, at the DEN pin, from the GPIO_DEN pin of microcontroller 406, is a low signal and that a signal received, at the IN pin, from the GPIO_OUT pin of microcontroller 406, is a high signal, SPS 408 may transition from the device on state to the LCCM ("IN=H; DEN=L" of 606).

In response to determining to transition from the device on state to the LCCM, SPS 408 may determine whether LCCM conditions are fulfilled (608). For example, in response to determining that the LCCM conditions are fulfilled, SPS 408 transitions to the LCCM ("YES" of 608). In response, however, to determining that the LCCM conditions are not fulfilled, SPS 408 returns to the device on state ("NO" of 608).

In response to SPS 408 transitioning to the LCCM (610), SPS 408 operates in LCCM. In response, to determining to exit the LCCM, SPS 408 outputs, at the IS pin, to the IS pin of microcontroller 406, a control signal indicating the state of SPS 408 is not the LCCM ("IS pin output current==rue" of 610) and returns to the device on state. For instance, in response to determining to exit the LCCM, SPS 408 may output, at the IS pin, to the IS pin of microcontroller 406, a high signal and microcontroller 406 may output, at the GPIO_DEN pin, to the DEN pin of SPS 408, a high signal and output, at the GPIO_OUT pin, to the IN pin of SPS 408, a high signal. In response, however, to determining to remain in the LCCM, SPS 408 outputs, at the IS pin, to the IS pin of microcontroller 406, a control signal indicating that the state of SPS 408 is the LCCM ("IS pin output current==false" of 610). For instance, in response to determining to remain in the LCCM, SPS 408 may output, at the IS pin, to the IS pin of microcontroller 406, a low signal and microcontroller 406 may output, at the GPIO_DEN pin, to the DEN pin of SPS 408, a low signal. As such, microcontroller 406 may output a low signal at the GPIO_OUT pin to the IN pin of SPS 408 to reduce a current consumption of SPS 408 ("IN=L; DEN=L" of 610) and may enter a sleep mode (612).

During sleep mode, microcontroller 406 may refrain from determining whether to output a high signal or a low signal at the GPIO_OUT pin to the IN pin of SPS 408. In some examples, during sleep mode, microcontroller 406 may refrain from operating one or more logical devices such that a power consumption of microcontroller 406 is minimized. In any case, in response to SPS 408 operating in sleep mode, microcontroller 406 determines whether a control signal received, from the IS pin of SPS 408, at the IS pin of microcontroller 406, indicates that a state of SPS 408 is the LCCM. In response to determining that the control signal indicates that the state of SPS 408 is the LCCM, microcontroller 406 refrains from exiting the sleep mode ("IS pin output current==false" of 612). In response, however, to determining that the control signal indicates that the state of SPS 408 is not the LCCM (e.g., to exit the LCCM mode), microcontroller 406 exits the sleep mode ("IS pin output current==true" of 612), and may output, from the GPIO_DEN pin, to the DEN pin of SPS 408, a high signal, and may output, from the GPIO_OUT pin, to the IN pin of SPS 408, a low signal to return to the device off state.

Figure 7:
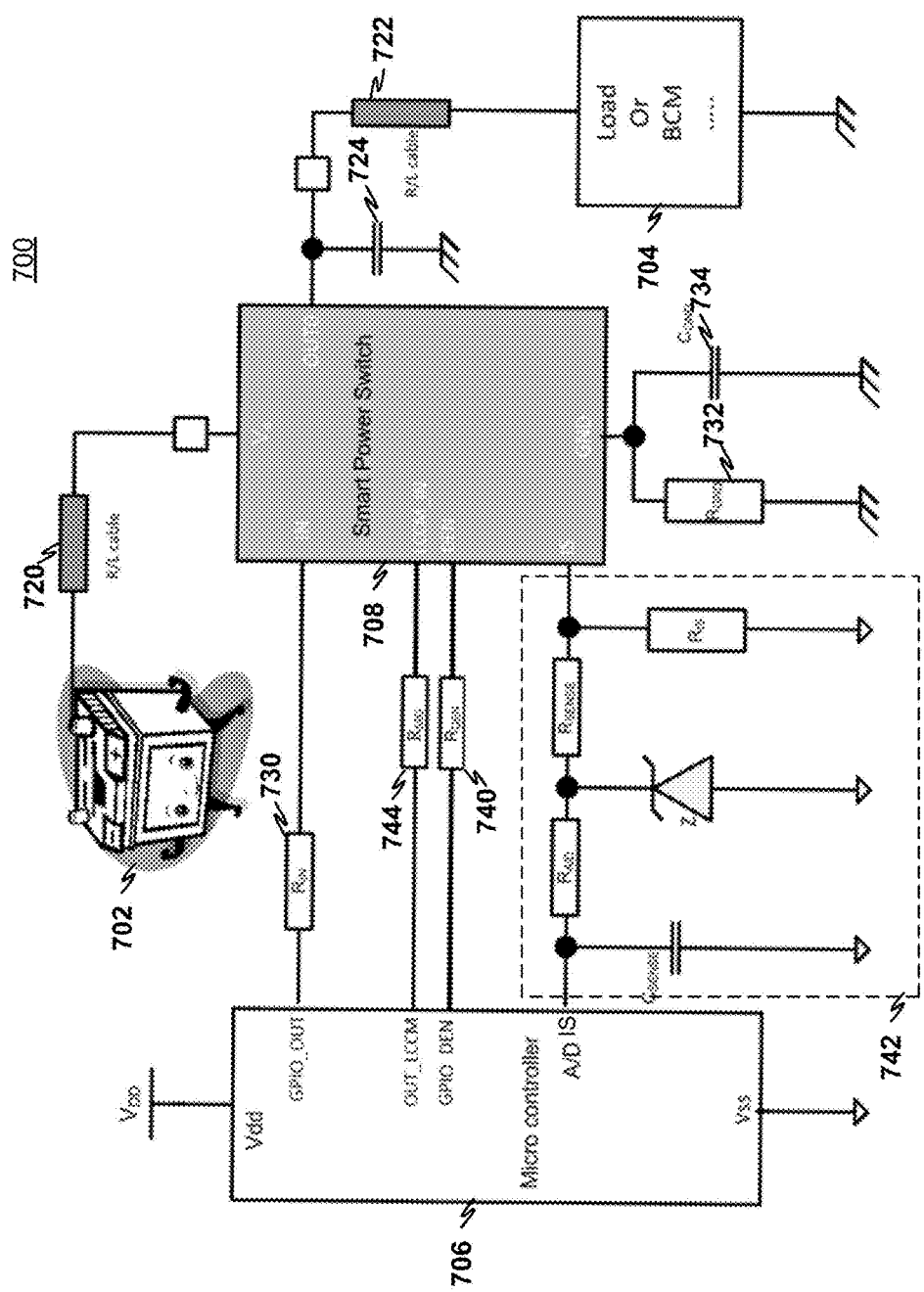
FIG. 7 is a circuit diagram illustrating an example third circuit of the system of FIG. 1, in accordance with one or more techniques of this disclosure.

FIG. 7 is a circuit diagram illustrating an example third circuit 700 of system 100 of FIG. 1, in accordance with one or more techniques of this disclosure. As illustrated circuit 700 includes battery 702, load 704, microcontroller 706, and smart power switch (SPS) 708. Battery 702 may be an example of energy storage unit 102 of FIG. 1. Load 704 may be an example of load 104A of FIG. 1. Microcontroller 706 may be an example of controller 106 of FIG. 1. SPS 708 may be an example of switching circuit 108 of FIG. 1.

SPS 708 may include a voltage source pin ($V_S$), a ground pin (GND), an input pin (IN), an output pin (OUT0), a diagnostics enable pin (DEN), a LCCM input pin (LCCM_IN), and a current diagnosis pin (IS). In some examples, SPS 708 may include an analog circuit. In some examples, SPS 708 may include a microcontroller on a single integrated circuit containing a processor core, memory, inputs, and outputs. In some examples, SPS 708 may include a combination of one or more analog components and one or more digital components.

In the example of FIG. 7, battery 702 is coupled, via cable 720, to the voltage source pin ($V_S$) of SPS 708. As shown, load 704 is coupled, via cable 722, to the output pin (OUT0) of SPS 708. Additionally, load 704 may be coupled to capacitor 724. In this manner, SPS 708 may selectively supply current from battery 702, via cables 720 and 722, to load 704.

Microcontroller 706 may include a ground pin ($V_{SS}$) coupled to ground, a voltage pin ($V_{DD}$) coupled to a voltage source (e.g., battery 702), a general purpose output pin (GPIO_OUT), a diagnostics enable pin (GPIO_DEN), and a current diagnosis pin (IS). In some examples, microcontroller 706 may be configured to determine whether to exit the LCCM. In some examples, microcontroller 706 may be on a single integrated circuit containing a processor core, memory, inputs, and outputs. In some examples, microcontroller 706 may be a combination of one or more analog components and one or more digital components.

The GPIO_OUT pin of microcontroller 706 is coupled, via resistive element 730, to the input pin (IN) of SPS 708. In this manner, microcontroller 706 may control, via SPS 708, a current flow from battery 702 to load 704. For instance, microcontroller 706 may output, from the GPIO_OUT pin of microcontroller 706 to the IN pin of SPS 708, a high signal (e.g., logical '1') to cause SPS 708 to permit current to flow from battery 702 to load 704, thereby activating load 704. However, microcontroller 706 may output, at the GPIO_OUT pin of microcontroller 706 to the IN pin of SPS 708, a low signal (e.g., logical '0') to cause SPS 708 to prevent current from flowing between battery 702 and load 704, thereby deactivating load 704.

In some examples, the GPIO_OUT pin of microcontroller 706 is coupled, via SPS 708, to the ground pin of SPS 708. In the example, the ground pin of SPS 708 is coupled, via resistive element 732, to a ground of circuit 700 and to capacitor 734. Resistive element 732 may be sized to prevent electromagnetic noise from inadvertently controlling SPS 708. For instance, resistive element 732 may be sized such that 29 micro-amperes (µA) is sufficient to control SPS 708. As previously discussed, permitting an 'IN' signal received at the IN pin of SPS 708 to be held low may reduce a current consumption by SPS 708 during LCCM by approximately 42% relative to a current consumption by SPS 708 when microcontroller 706 outputs a high signal to the IN pin of SPS 708.

Microcontroller 706 and SPS 708 may be configured for a diagnostics mode. In some examples, microcontroller 706 may initiate the diagnostics mode by outputting, via resistive element 740, a diagnostics signal from the GPIO_DEN pin of microcontroller 706 to the DEN pin of SPS 708. In the example, the IS pin of microcontroller 706 may detect one or more electrical characteristics (e.g., voltage, current, or another electrical characteristic) using diagnostics circuit 742.

Rather than microcontroller 706 necessarily outputting, at the GPIO_OUT pin, to the IN pin of SPS 708, a high signal, SPS 708 may be configured to permit microcontroller 706 to output, at the GPIO_OUT pin, to the IN pin of SPS 708, a low signal during the LCCM state. SPS 708 may determine whether the state of SPS 708 is the LCCM, and may output, at the IS pin, via diagnostics circuit 742, to the IS pin of microcontroller 706, an indication that the state of SPS 708 is or is not the LCCM. Additionally, SPS 708 may receive an instruction, at the LCCM_IN pin, from the OUT_LCCM pin of microcontroller 706, to remain in the LCCM or to exit the LCCM. In this manner, microcontroller 706 and SPS 708 may be configured to permit an 'IN' signal received at the IN pin of SPS 708 to be held low to reduce a current consumption by SPS 708 during LCCM.

Figure 8:
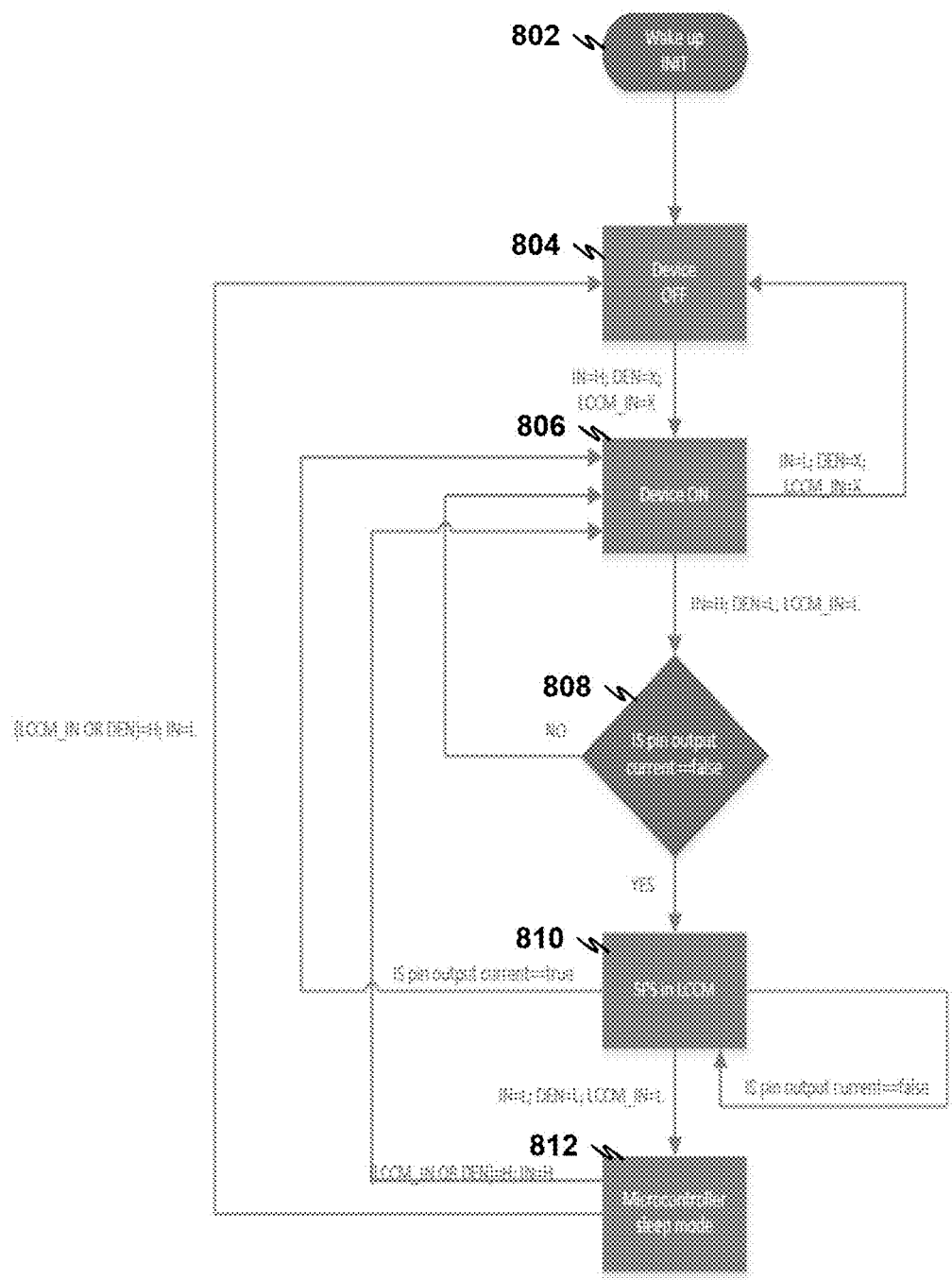
FIG. 8 is a flow diagram consistent with techniques that may be performed by the third example circuit of FIG. 7, in accordance with this disclosure.

FIG. 8 is a flow diagram consistent with techniques that may be performed by the third example circuit 700 of FIG. 7, in accordance with this disclosure. For purposes of illustration only, the example operations are described below within the context of circuit 700, as shown in FIG. 7. However, the techniques described below can be used in any permutation, and in any combination, with battery 702, load 704, microcontroller 706, and SPS 708.

In accordance with one or more techniques of this disclosure, microcontroller 706 wakes up and initializes (802). For instance, battery 702 may be coupled to the $V_{DD}$ and $V_{SS}$ pins of microcontroller 706. In response to waking up and initializing, microcontroller 706 operates in a device off state (804). For instance, microcontroller 706 may output a low signal (e.g., logical '0') to cause SPS 708 to prevent current from flowing between battery 702 and load 704, thereby deactivating load 704. During the device off state, microcontroller 706 ignores whether a state of circuit 700 includes a diagnostics mode. For instance, microcontroller 706 ignores a signal on the GPIO_DEN pin of microcontroller 706 during the device off state. In some instances, microcontroller 706 refrains from determining whether circuit 700 is in the diagnostics state.

In the example of FIG. 8, microcontroller 706 determines whether to transition from the device off state to the device on state. In response to determining to transition from the device off state to the device on state ("IN=H; DEN=X; LCCM_IN=X" of 804), microcontroller 706 operates in the device on state (806). For example, during the device on state, microcontroller 706 may output, at the GPIO_OUT pin, to the IN pin of SPS 708, a high signal (e.g., logical '1') to cause SPS 708 to permit current to flow from battery 702 to load 704, thereby activating load 704. During the device on state, microcontroller 706 determines whether to transition from the device on state to the device off state. In response to determining to transition from the device on state to the device off state, microcontroller 706 transitions from the device on state to the device off state ("IN=L; DEN=X; LCCM_IN=X" of 806).

During the device on state, SPS 708 determines whether to transition from the device on state to the LCCM. For example, in response to SPS 708 determining that a signal received, at the DEN pin, from the GPIO_DEN pin of microcontroller 706, is a low signal, that a signal received, at the IN pin, from the GPIO_OUT pin of microcontroller 706, is a high signal, and that a signal received, at the LCCM_IN pin of SPS 708, from the OUT_LCCM pin of microcontroller 706, is a low signal, SPS 708 transition from the device on state to the LCCM ("IN=H; DEN=L; LCCM_IN=L" of 806).

In response to determining to transition from the device on state to the LCCM, SPS 708 determines whether one or more LCCM conditions are fulfilled (808). For example, in response to determining that the one or more LCCM conditions are fulfilled, SPS 708 transitions to the LCCM ("YES" of 808). In response, however, to determining that the one or more LCCM conditions are not fulfilled, SPS 708 returns to the device on state ("NO" of 808).

In response to SPS 708 transitioning to the LCCM (810), SPS 708 may determine whether to exit the LCCM or to remain in the LCCM. In response, to determining to exit the LCCM, SPS 708 returns to the device on state ("IS pin output current=true" of 810). In the example, in response to receiving the control signal indicating that the state of SPS 708 is not the LCCM, microcontroller 708 may output, at the GPIO_DEN pin of microcontroller 706 to the DEN pin of SPS 708, a low signal and output, at the OUT_LCCM pin of microcontroller 706 to the LCCM_IN pin of SPS 708 a high signal. However, in response to determining to remain in the LCCM, SPS 708 may output, at the IS pin, to the IS pin of microcontroller 706, a control signal indicating that the state of SPS 708 is the LCCM ("IS pin output current=false" of 810). In the example, in response to receiving the control signal indicating that the state of SPS 708 is the LCCM, microcontroller 708 may output, at the GPIO_DEN pin of microcontroller 706 to the DEN pin of SPS 708, a low signal and output, at the OUT_LCCM pin of microcontroller 706 to the LCCM_IN pin of SPS 708 a low signal. However, in response to determining to remain in the LCCM and entering a sleep mode, microcontroller 706 may output, at the GPIO_OUT pin of microcontroller 706 to the IN pin of SPS 708, at the GPIO_DEN pin of microcontroller 706 to the DEN pin of SPS 708, and at the OUT_LCCM pin of microcontroller 706 to the LCCM_IN pin of SPS 708 a low signal ("IN=L; DEN=L; LCCM_IN=L" of 810), and enter a sleep mode (812).

During sleep mode, microcontroller 706 refrains from determining whether to output, at the GPIO_OUT pin, to the IN pin of SPS 708, a high signal or a low signal. In some examples, during sleep mode, microcontroller 706 may refrain from operating one or more logical devices such that a power consumption of microcontroller 706 is minimized. In some examples, microcontroller 706 may receive a command to wake up and/or exit the LCCM, for instance, from a signal received at a dedicated input pin of microcontroller 706, from a bus interface message received by microcontroller, and/or from an internal state machine detecting an idle mode. In some examples, microcontroller 706 itself detects the idle mode.

In any case, in response to determining to exit the LCCM and determining to operate the device in the device on state, microcontroller 706 exits the sleep mode, outputs, at the OUT_LCCM pin to the LCCM_IN pin of SPS 708, a high signal, outputs, at the GPIO_OUT pin, to the IN pin of SPS 708, a high signal, and returns to the device on state ("LCCM_IN OR DEN=H; IN=H" of 812). Similarly, in response to determining to exit the LCCM and determining to operate the device in a diagnostics state, microcontroller 706 exits the sleep mode, outputs, at the GPIO_DEN pin to the DEN pin of SPS 708, a high signal, outputs, at the GPIO_OUT pin to the IN pin of SPS 708, a high signal, and returns to the device on state ("LCCM_IN OR DEN=H; IN=H" of 812). In response, however, to determining to exit the LCCM and determining to operate the device in the device off state, microcontroller 706 exits the sleep mode, outputs, at the OUT_LCCM pin of microcontroller 706, to the LCCM_IN pin of SPS 708, a high signal, outputs, at the GPIO_OUT pin to the IN pin of SPS 708, a low signal and returns to the device off state ("LCCM_IN OR DEN=H; IN=L" of 812).

In the example of FIG. 8, circuit 700 may permit microcontroller 706 to deactivate a diagnostics mode on the IS pins of microcontroller 706 and SPS 708 using the GPIO_DEN pin of microcontroller 706 and the DEN pin of SPS 708 while permitting microcontroller 706 to output on the GPIO_OUT pin a low signal, thereby reducing a current consumption of SPS 708. More specifically, during the sleep mode of microcontroller 706 and in response to determining to deactivate the diagnostics mode on the IS pins of microcontroller 706 and SPS 708, microcontroller 706 may deactivate the diagnostics mode by outputting, at the GPIO_DEN pin of microcontroller 706 and to the DEN pin of SPS 708, a low signal.

Figure 9:
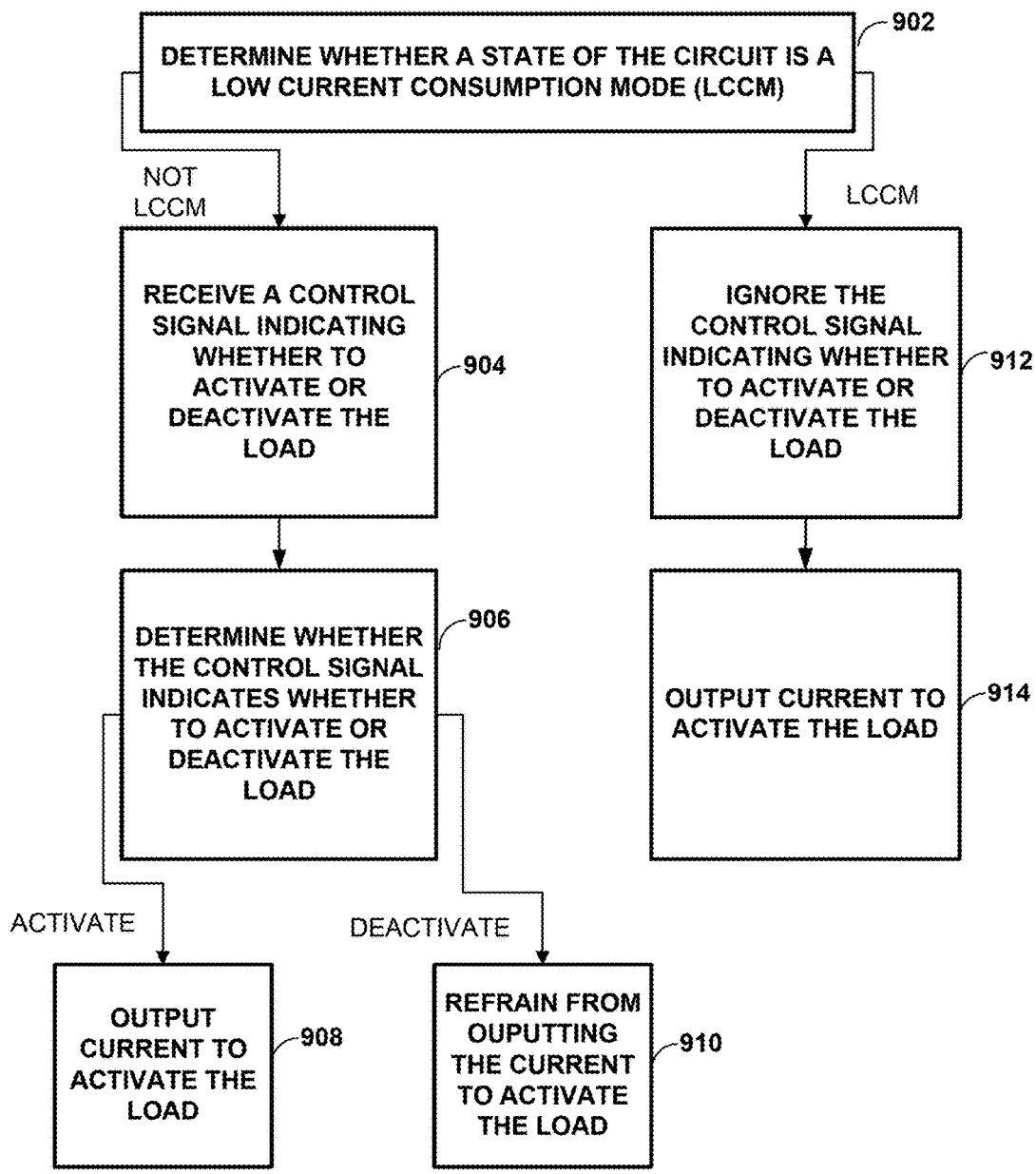
FIG. 9 is a flow diagram consistent with techniques that may be performed by a circuit in accordance with this disclosure.

FIG. 9 is a flow diagram consistent with techniques that may be performed by a circuit in accordance with this disclosure. For purposes of illustration only, the example operations are described below within the context of system 100, as shown in FIG. 1. However, the techniques described below can be used in any permutation, and in any combination, with energy storage unit 102, loads 104, controller 106, and switching circuit 108.

In accordance with one or more techniques of this disclosure, switching circuit 108 determines whether a state of system 100 is a LCCM (902). For example, switching circuit 108 determines whether the state of switching circuit 108 is the LCCM based on a signal received on a dedicated input pin of switching circuit 108, one or more bus interface messages received by control module 112 of switching circuit 108, and/or one or more internal state machines of control module 112. In another example, controller 106 determines whether the state of system 100 is the LCCM based on a signal received on a dedicated input pin of controller 106, one or more bus interface messages received by control module 112 of switching circuit 108, and/or one or more internal state machines of control module 112. In the example, in response to controller 106 determining that the state of system 100 is the LCCM, controller 106 outputs, to switching circuit 108, a command signal indicating that the state of system 100 is the LCCM, and switching circuit 108 determines whether the state of switching circuit 108 is the LCCM according to the command signal output from controller 106.

After determining that switching circuit 108 is not in the LCCM ("NOT LCCM" of 902), switching circuit 108 receives a control signal indicating whether to activate or deactivate load 104A (904). In response to receiving the control signal, switching circuit 108 determines whether the control signal indicates whether to activate or deactivate load 104A (906). For example, switching circuit 108 determines whether to activate or deactivate load 104A based on a line level at an IN pin of switching circuit 108.

In response to determining that the control signal indicates to activate load 104A ("ACTIVATE" of 906), switching circuit 108 outputs current to activate load 104A (908). For instance, switching circuit 108 couples energy storage unit 102 in series, with load 104A. In response, however, to determining that the control signal indicates to deactivate load 104A ("DEACTIVATE" of 906), switching circuit 108 refrains from outputting the current to activate load 104A (910). For instance, switching circuit 108 may refrain from coupling energy storage unit 102 in series, with load 104A until the control signal received at the input of the switching circuit 108 indicates to activate load 104A.

However, after determining that switching circuit 108 is in the LCCM ("LCCM" of 902), switching circuit 108 ignores the control signal indicating whether to activate or deactivate the load (912). Additionally, switching circuit 108 outputs the current to activate load 104A (914). For example, switching circuit 108 outputs, at an output of switching circuit 108, current to activate load 104A when the control signal received at the input of the switching circuit 108 indicates to activate load 104A and when the control signal received at the input of the switching circuit 108 indicates to deactivate load 104A.

The following examples may illustrate one or more aspects of the disclosure.

Example 1

A method comprising: determining, by a circuit, whether a state of the circuit is a low current consumption mode (LCCM); in response to determining that the state of the circuit is not the LCCM: determining, by the circuit, whether a control signal received at an input of the circuit indicates whether to activate or deactivate a load; and in response to determining that the control signal received at the input of the circuit indicates to activate the load, outputting, at an output of the circuit, current to activate the load; and in response to determining that the state of the circuit is the LCCM: ignoring, by the circuit, the control signal indicating whether to activate or deactivate the load; and outputting, by the circuit, at the output of the circuit, the current to activate the load.

Example 2

The method of example 1, further comprising: in response to determining that the state of the circuit is not the LCCM: in response to determining that the control signal indicates to deactivate the load, refraining from outputting, at the output of the circuit, the current to activate the load.

Example 3

The method of any combination of examples 1-2, further comprising: in response to determining that the state of the circuit is the LCCM: determining, by the circuit, whether a condition to exit the LCCM exists; and in response to determining that the condition to exit the LCCM exists, determining that the state of the circuit is not the LCCM.

Example 4

The method of any combination of examples 1-3, further comprising: in response to determining that the condition to exit the LCCM does not exist, refraining from changing the state of the circuit from the LCCM.

Example 5

The method of any combination of examples 1-4, further comprising: receiving, when the state of the circuit is the LCCM, at a control input of the circuit configured for a diagnostic mode at the circuit, an instruction to exit the LCCM; and in response to receiving the instruction to exit the LCCM, determining that the state of the circuit is not the LCCM.

Example 6

The method of any combination of examples 1-5, further comprising: in response to determining that the condition to exit the LCCM exists, outputting, at a control output configured to indicate to a controller when to exit the LCCM, an indication that the state of the circuit is not the LCCM, wherein the controller outputs the control signal to the input of the circuit.

Example 7

The method of any combination of examples 1-6, further comprising: receiving, when the state of the circuit is the LCCM, at a control input of the circuit, an instruction to exit the LCCM; and in response to receiving the instruction to exit the LCCM, determining that the state of the circuit is not the LCCM.

Example 8

A circuit comprising: an input configured to receive a control signal indicating whether to activate or deactivate a load; an output configured to supply current to activate the load; and a control module configured to: determine whether a state of the circuit is a low current consumption mode (LCCM); in response to determining that the state of the circuit is not the LCCM: determine whether the control signal indicates to activate the load; and in response to determining that the control signal indicates to activate the load, output, at the output, the current to activate the load; and in response to determining that the state of the circuit is the LCCM: ignore the control signal indicating whether to activate or deactivate the load; and output, at the output, the current to activate the load.

Example 9

The circuit of example 8, wherein the control module is further configured to: in response to determining that the state of the circuit is not the LCCM: in response to determining that the control signal indicates to deactivate the load, refrain from outputting, at the output, the current to activate the load.

Example 10

The circuit of any combination of examples 8-9, wherein the control module is further configured to: in response to determining that the state of the circuit is the LCCM: determine whether a condition to exit the LCCM exists; and in response to determining that the condition to exit the LCCM exists, determine that the state of the circuit is not the LCCM.

Example 11

The circuit of any combination of examples 8-10, wherein the control module is further configured to: in response to determining that the condition to exit the LCCM does not exist, refrain from changing the state of the circuit from the LCCM.

Example 12

The circuit of any combination of examples 8-11, further comprising: a control input configured for a diagnostic mode at the circuit, wherein the control module is further configured to: determine whether a command signal received at the control input configured for the diagnostic mode at the circuit indicates an instruction to exit the LCCM; and in response to determining that the command signal received at the control input indicates the instruction to exit the LCCM, determine that the state of the circuit is not the LCCM.

Example 13

The circuit of any combination of examples 8-12, further comprising: a control output configured to transmit, to a controller, an indication that the condition to exit the LCCM exists, wherein the controller outputs the control signal to the input, and wherein the control module is further configured to: in response to determining that the condition to exit the LCCM exists, output, at the control output, to the controller, an indication that the state of the circuit is not the LCCM.

Example 14

The circuit of any combination of examples 8-13, further comprising: a control input configured to receive, an instruction to exit the LCCM, wherein the control module is further configured to: in response to determining that the state of the circuit is the LCCM: determine whether a command signal received at the control input indicates the instruction to exit the LCCM; and in response to determining that the command signal received at the control input indicates the instruction to exit the LCCM, determine that the state of the circuit is not the LCCM.

Example 15

The circuit of any combination of examples 8-14, wherein the control module is further configured to: in response to determining that the command signal received at the control input indicates instructions to remain in the LCCM, determine that the state of the circuit is the LCCM.

Example 16

A system comprising: a first load; a second load; an energy storage unit configured to supply energy to the first load and to the second load; a controller configured to output one or more control signals indicating whether to activate the first load and whether to activate the second load; and a switching circuit configured to: determine whether a state of the system is a low current consumption mode (LCCM); in response to determining that the state of the system is not the LCCM: selectively couple the energy storage unit to the first load and to the second load based on the one or more control signals; and in response to determining that the state of the system is the LCCM: ignore the one or more control signals indicating whether to activate the first load and whether to activate the second load; and couple the energy storage unit to the first load and to the second load.

Example 17

The system of example 16, wherein the switching circuit is further configured to: in response to determining that the state of the system is the LCCM: determine whether a condition to exit the LCCM exists; and in response to determining that the condition to exit the LCCM exists, determine that the state of the system is not the LCCM.

Example 18

The system of any combination of examples 16-17, wherein the switching circuit comprises: a control input configured for a diagnostic mode at the switching circuit, wherein the switching circuit is further configured to: determine whether a command signal received at the control input configured for the diagnostic mode at the switching circuit indicates an instruction to exit the LCCM; and in response to determining that the command signal received at the control input indicates the instruction to exit the LCCM, determine that the state of the circuit is not the LCCM.

Example 19

The system of any combination of examples 16-18, wherein the switching circuit comprises: a control output configured to transmit, to the controller, an indication that the condition to exit the LCCM exists, wherein the switching circuit is further configured to: in response to determining that the condition to exit the LCCM exists, output, at the control output, to the controller, an indication that the state of the system is not the LCCM.

Example 20

The system of any combination of examples 16-19, wherein the switching circuit comprises: a control input configured to receive, from the controller, an indication that a condition to exit the LCCM exists, wherein the switching circuit is further configured to: in response to determining that the state of the system is the LCCM: determine whether a command signal received at the control input indicates an instruction to exit the LCCM; and in response to determining that the command signal received at the control input indicates the instruction to exit the LCCM, determine that the state of the system is not the LCCM.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure.

Such hardware, software, and firmware may be implemented within the same device or within separate devices to support the various techniques described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware, firmware, or software components. Rather, functionality associated with one or more modules or units may be performed by separate hardware, firmware, or software components, or integrated within common or separate hardware, firmware, or software components.

Various aspects have been described in this disclosure. These and other aspects are within the scope of the following claims.

The invention claimed is:

1. A method comprising:
    determining, by a circuit, whether a state of the circuit is a low current consumption mode (LCCM);
    in response to determining that the state of the circuit is not the LCCM:
        determining, by the circuit, whether a control signal received at an input of the circuit indicates whether to activate or deactivate a load; and
        in response to determining that the control signal received at the input of the circuit indicates to activate the load, outputting, at an output of the circuit, current to activate the load; and
    in response to determining that the state of the circuit is the LCCM:
        ignoring, by the circuit, the control signal indicating whether to activate or deactivate the load; and
        outputting, by the circuit, at the output of the circuit, the current to activate the load.

2. The method of claim 1, further comprising:
    in response to determining that the state of the circuit is not the LCCM:
        in response to determining that the control signal indicates to deactivate the load, refraining from outputting, at the output of the circuit, the current to activate the load.

3. The method of claim 1, further comprising:
    in response to determining that the state of the circuit is the LCCM:
        determining, by the circuit, whether a condition to exit the LCCM exists; and
        in response to determining that the condition to exit the LCCM exists, determining that the state of the circuit is not the LCCM.

4. The method of claim 3, further comprising:
    in response to determining that the condition to exit the LCCM does not exist, refraining from changing the state of the circuit from the LCCM.

5. The method of claim 3, further comprising:
    receiving, when the state of the circuit is the LCCM, at a control input of the circuit configured for a diagnostic mode at the circuit, an instruction to exit the LCCM; and
    in response to receiving the instruction to exit the LCCM, determining that the state of the circuit is not the LCCM.

6. The method of claim 3, further comprising:
    in response to determining that the condition to exit the LCCM exists, outputting, at a control output configured to indicate to a controller when to exit the LCCM, an indication that the state of the circuit is not the LCCM, wherein the controller outputs the control signal to the input of the circuit.

7. The method of claim 1, further comprising:
    receiving, when the state of the circuit is the LCCM, at a control input of the circuit, an instruction to exit the LCCM; and in response to receiving the instruction to exit the LCCM, determining that the state of the circuit is not the LCCM.

8. A circuit comprising:
an input configured to receive a control signal indicating whether to activate or deactivate a load;
an output configured to supply current to activate the load; and
a control module configured to:
  determine whether a state of the circuit is a low current consumption mode (LCCM);
  in response to determining that the state of the circuit is not the LCCM:
    determine whether the control signal indicates to activate the load; and
    in response to determining that the control signal indicates to activate the load, output, at the output, the current to activate the load; and
  in response to determining that the state of the circuit is the LCCM:
    ignore the control signal indicating whether to activate or deactivate the load; and
    output, at the output, the current to activate the load.

9. The circuit of claim 8, wherein the control module is further configured to:
in response to determining that the state of the circuit is not the LCCM:
  in response to determining that the control signal indicates to deactivate the load, refrain from outputting, at the output, the current to activate the load.

10. The circuit of claim 8, wherein the control module is further configured to:
in response to determining that the state of the circuit is the LCCM:
  determine whether a condition to exit the LCCM exists; and
  in response to determining that the condition to exit the LCCM exists, determine that the state of the circuit is not the LCCM.

11. The circuit of claim 10, wherein the control module is further configured to:
in response to determining that the condition to exit the LCCM does not exist, refrain from changing the state of the circuit from the LCCM.

12. The circuit of claim 10, further comprising:
a control input configured for a diagnostic mode at the circuit,
wherein the control module is further configured to:
  determine whether a command signal received at the control input configured for the diagnostic mode at the circuit indicates an instruction to exit the LCCM; and
  in response to determining that the command signal received at the control input indicates the instruction to exit the LCCM, determine that the state of the circuit is not the LCCM.

13. The circuit of claim 10, further comprising:
a control output configured to transmit, to a controller, an indication that the condition to exit the LCCM exists,
wherein the controller outputs the control signal to the input, and
wherein the control module is further configured to:
  in response to determining that the condition to exit the LCCM exists, output, at the control output, to the controller, an indication that the state of the circuit is not the LCCM.

14. The circuit of claim 8, further comprising:
a control input configured to receive, an instruction to exit the LCCM,
wherein the control module is further configured to:
  in response to determining that the state of the circuit is the LCCM:
    determine whether a command signal received at the control input indicates the instruction to exit the LCCM; and
    in response to determining that the command signal received at the control input indicates the instruction to exit the LCCM, determine that the state of the circuit is not the LCCM.

15. The circuit of claim 14, wherein the control module is further configured to:
in response to determining that the command signal received at the control input indicates instructions to remain in the LCCM, determine that the state of the circuit is the LCCM.

16. A system comprising:
a first load;
a second load;
an energy storage unit configured to supply energy to the first load and to the second load;
a controller configured to output one or more control signals indicating whether to activate the first load and whether to activate the second load; and
a switching circuit configured to:
  determine whether a state of the system is a low current consumption mode (LCCM);
  in response to determining that the state of the system is not the LCCM:
    selectively couple the energy storage unit to the first load and to the second load based on the one or more control signals; and
  in response to determining that the state of the system is the LCCM:
    ignore the one or more control signals indicating whether to activate the first load and whether to activate the second load; and
    couple the energy storage unit to the first load and to the second load.

17. The system of claim 16, wherein the switching circuit is further configured to:
in response to determining that the state of the system is the LCCM:
  determine whether a condition to exit the LCCM exists; and
  in response to determining that the condition to exit the LCCM exists, determine that the state of the system is not the LCCM.

18. The system of claim 17, wherein the switching circuit comprises:
a control input configured for a diagnostic mode at the switching circuit,
wherein the switching circuit is further configured to:
  determine whether a command signal received at the control input configured for the diagnostic mode at the switching circuit indicates an instruction to exit the LCCM; and
  in response to determining that the command signal received at the control input indicates the instruction to exit the LCCM, determine that the state of the circuit is not the LCCM.

19. The system of claim 17, wherein the switching circuit comprises:
a control output configured to transmit, to the controller, an indication that the condition to exit the LCCM exists,
wherein the switching circuit is further configured to:
in response to determining that the condition to exit the LCCM exists, output, at the control output, to the controller, an indication that the state of the system is not the LCCM.

20. The system of claim 16, wherein the switching circuit comprises:
a control input configured to receive, from the controller, an indication that a condition to exit the LCCM exists,
wherein the switching circuit is further configured to:
in response to determining that the state of the system is the LCCM:
determine whether a command signal received at the control input indicates an instruction to exit the LCCM; and
in response to determining that the command signal received at the control input indicates the instruction to exit the LCCM, determine that the state of the system is not the LCCM.

* * * * *